United States Patent [19]

Sakamoto et al.

[11] Patent Number: 4,725,182
[45] Date of Patent: Feb. 16, 1988

[54] PRINTED CIRCUIT BOARD LOAD-UNLOAD SYSTEM AND METHOD

[75] Inventors: Hideo Sakamoto, Oyama; Yoshikuni Kawakami, Tochigi, both of Japan

[73] Assignee: Fujitsu Limited, Kawasaki, Japan

[21] Appl. No.: 57,647

[22] Filed: Jun. 8, 1987

Related U.S. Application Data

[63] Continuation of Ser. No. 692,172, Jan. 17, 1985, abandoned.

[30] Foreign Application Priority Data

Jan. 21, 1984 [JP] Japan .................. 59-007924
Jan. 21, 1984 [JP] Japan .................. 59-007922
Jan. 21, 1984 [JP] Japan .................. 59-007923

[51] Int. Cl.$^4$ .................................... H05K 13/02
[52] U.S. Cl. .................. 414/331; 198/465.1; 414/280; 414/417; 901/39
[58] Field of Search .......... 414/280, 331, 416, 417, 414/422, 730, 222, 225, 226; 901/39, 47; 187/32; 198/465.1; 294/106, 902

[56] References Cited

U.S. PATENT DOCUMENTS

| | | | |
|---|---|---|---|
| 3,240,365 | 3/1966 | King | 414/280 X |
| 3,850,316 | 11/1974 | Schmitt | 414/280 X |
| 3,902,615 | 9/1975 | Levy et al. | 414/331 |
| 3,945,505 | 3/1976 | Frisbie et al. | 414/331 |
| 4,141,458 | 2/1979 | Brooks et al. | 414/331 |
| 4,286,380 | 9/1981 | Blount | 901/47 X |
| 4,367,915 | 1/1983 | Georges | 414/417 X |
| 4,368,913 | 1/1983 | Brockmann et al. | 294/106 |
| 4,449,625 | 5/1984 | Grieben et al. | 198/465.1 |
| 4,468,165 | 8/1984 | Kawasaki | 414/417 |
| 4,550,239 | 10/1985 | Uehara et al. | 414/331 X |
| 4,558,983 | 12/1985 | Freeman et al. | 414/280 X |

FOREIGN PATENT DOCUMENTS 0035844 9/1981 European Pat. Off. .
0085837 8/1983 European Pat. Off. .

OTHER PUBLICATIONS

European Search Report dated 4/22/85.

Primary Examiner—Joseph E. Valenza
Assistant Examiner—David A. Bucci
Attorney, Agent, or Firm—Staas & Halsey

[57] ABSTRACT

A printed circuit board, load-unload system which has a printed circuit board processing portion; a magazine stock portion where a plurality of magazines, each of which houses a plurality of printed circuit boards, is arranged on a conveyor route; and a load-unload portion where one of the plurality of printed circuit boards is transferred between one of the plurality of the magazines in the magazine stock portion and the printed circuit board processing portion. The conveyor route of the stock portion includes a bypass route which bypasses the load-unload portion.

1 Claim, 43 Drawing Figures

PRINTED CIRCUIT BOARD LOAD-UNLOAD SYSTEM AND METHOD

This is a continuation of co-pending application Ser. No. 692,172, filed on Jan. 17, 1985, now abandoned.

BACKGROUND OF THE INVENTION

The present invention relates to a load-unload system and method for transferring printed circuit boards (P.C.B.'s) to a processing device, such as an inserter for mounting electronic components on a printed wiring board or a tester for testing a function of the circuit of a printed circuit board provided with electronic components.

"Printed circuit board" in this specification includes both a printed wiring board on which electric or electronic components are to be mounted and a printed circuit board on which electric or electronic components are already mentioned for formation of a circuit thereon.

In the production of printed circuit boards, the printed circuit boards are housed in a magazine for conveyance from one process to a subsequent process so as to facilitate handling and to protect the boards. During some processes, a load-unload system draws the printed circuit boards from the magazine and supplies them to a processing device. After the processing of the printed circuit boards, the boards are discharged from the device and placed in the same or another magazine by the load-unload system.

There are two known kinds of printed circuit board load-unload systems. One is a pass-through-type in which the printed circuit boards discharged from the processing device are transferred to a new magazine. The other is a return-type in which the printed circuit boards discharged from the processing device are returned to the original magazine. The return-type is better than the pass-through-type from the standpoint of the installation space requirements of the system, since the latter requires space for stocking empty magazines for receiving printed circuit boards discharged from the processing device, in addition to space for stocking magazines housing printed circuit boards to be processed by the device.

A return-type, load-unload system according to the prior art includes a magazine stocker unit, in which a plurality of magazines are arranged on a conveyor unit, and a load-unload unit, by which printed circuit boards housed in each magazine are fed to a processing device in series, one after another, and returned to each magazine after processing.

The prior art return-type, load-unload system, however, is complicated in construction and the efficiency of supplying the printed circuit boards to the processing device is low.

Also, the load-unload unit of the prior art system deals with the magazines in sequence according to the order of the arrangement in the magazine stocker unit. It cannot automatically change the sequence. Therefore, if a magazine which houses printed circuit boards different from those to be processed by the processing device is inadvertently mixed in with the magazines in the stocker unit, a human operator must stop the system and change the arrangement of the processing device so that the different magazine can be processed, or remove that magazine when it reaches the load-unload unit. When the system is operated by automatic control, the processing device is usually designed to automatically stop when such a magazine reaches the load-unload unit.

In short-run production, which has become increasingly widespread recently, a testing machine must also be able to perform a plurality of tests. Each time the printed circuit pattern is changed, new testing steps and instruments must be set in the machine. Obviously, it is best to test printed circuit boards having the same circuit pattern in series continuously. Therefore, it is desirable to arrange magazines including printed circuit boards of the same type in series. Until now, however, magazines including printed circuit boards having different patterns have been supplied to the stocker unit of the load-unload system at random. It is desirable to be able to group the magazines in the stocker unit so that the same magazines are continuously fed to the testing machine.

SUMMARY OF THE INVENTION

An object of the present invention is to provide a printed circuit board, load-unload system which features a simplified construction and which can efficiently transfer printed circuit boards between a processing device and stock means.

Another object is to provide a printed circuit board, load-unload system and method in which the order of magazines can be changed by grouping the magazines in the stock means so that the processing device can continuously carry out the same processing operation.

In accordance with the present invention, there is provided a printed circuit board, load-unload system, including; a printed circuit board processing portion; a stock portion in which a plurality of magazines housing a plurality of printed circuit boards are arranged on a conveyor route; and a load-unload portion for transferring printed circuit boards between magazines in the stock portion and the printed circuit board processing portion. The conveyor route of the stock portion includes a bypass route which bypasses the load-unload portion and performs the grouping function.

A preferred embodiment of the present invention is a printed circuit board, load-unload system in which a printed circuit board transfer means is provided at one end of the stock means and a magazine transfer means which is connected from/to outside systems is provided at the other end of the stock means.

DETAILED DESCRIPTION OF THE PREFERRED EMBODIMENTS

Embodiments of the printed circuit board, load-unload system in accordance with the present invention will be described in detail hereinafter with reference to the drawings.

Figure 1:
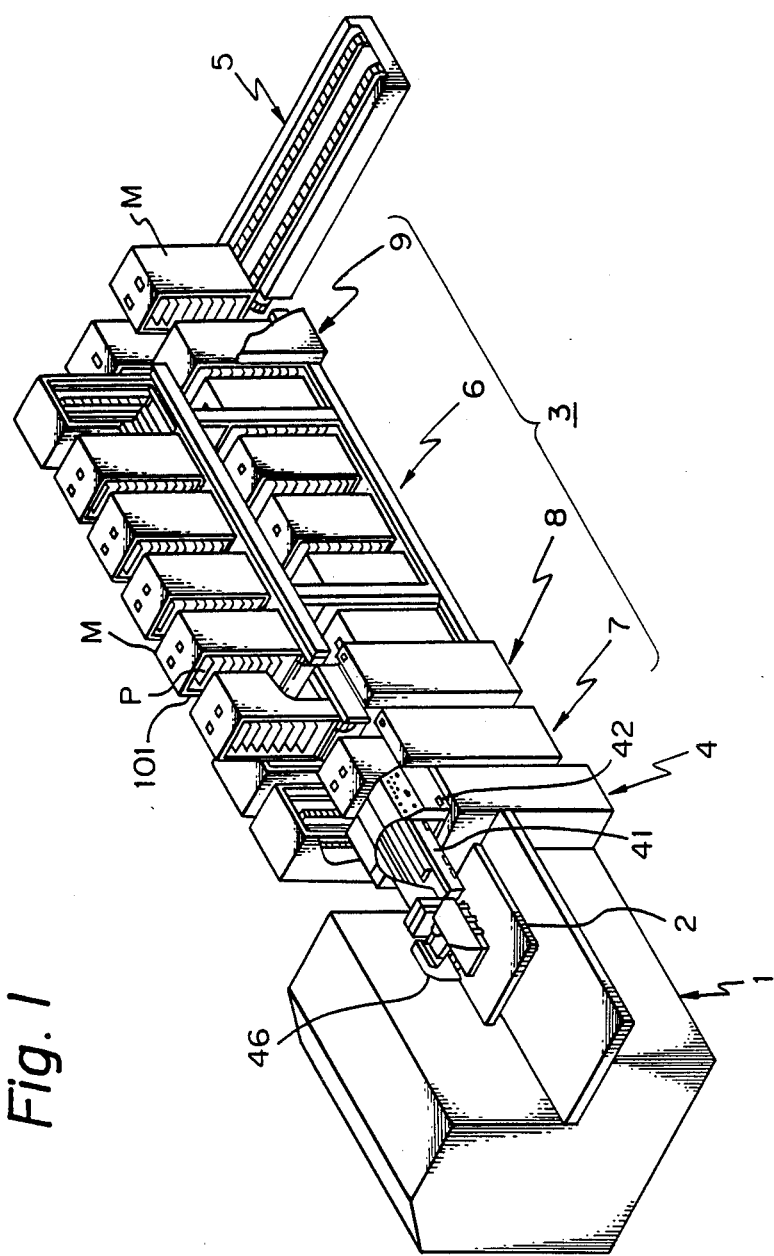
FIG. 1 is a perspective view of an embodiment of a printed circut board, load-unload system in accordance with the present invention.
Figure 2:
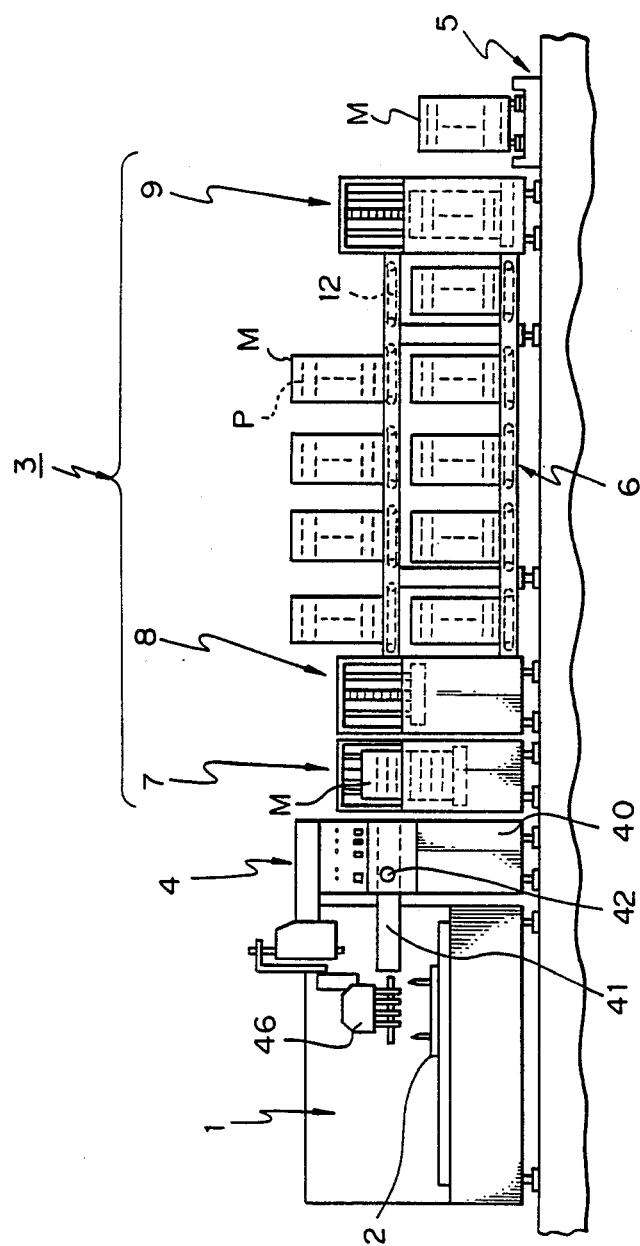
FIG. 2 is a side view of the printed circuit board, load-unload system of FIG. 1.

A first embodiment of the present invention is illustrated in FIGS. 1 and 2. In the drawings, numeral 1 designates an inserter for mounting integrated circuit (IC) components on a printed circuit board and numeral 2 designates an X-Y table on which the printed circuit board is mounted. The X-Y table 2 is movable between a printed circuit board mounting and dismounting position (position shown in FIG. 1) and an IC component insertion position where IC's are mounted on the printed circuit board.

The illustrated first embodiment further includes magazine stock means 3, printed circuit board transferring means 4, and a conveyor 5 for conveying magazines M to be transferred to or from the outside (e.g., other processing systems). The magazine stock means 3 includes: a conveyor unit 6 on which aplurality of magazines M housing a plurality of printedcircuit boards P are mounted; two elevator units 7 and 8 disposed at the front end of the conveyor unit 6; and an elevator unit 9 disposed at the rear end of the conveyor unit 6. Each magazine M includes a rectangular frame 101, the front and rear (right and left in FIG. 2) faces of which are open. In each magazine M, each of the plurality of printed circuit boards is horizontally supported on a guide rail (not shown) disposed on each side wall thereof. Each printed circuit board P is inserted into and drawn out of the magazine M through the front open face (left face in FIG. 2) thereof.

Figure 3:
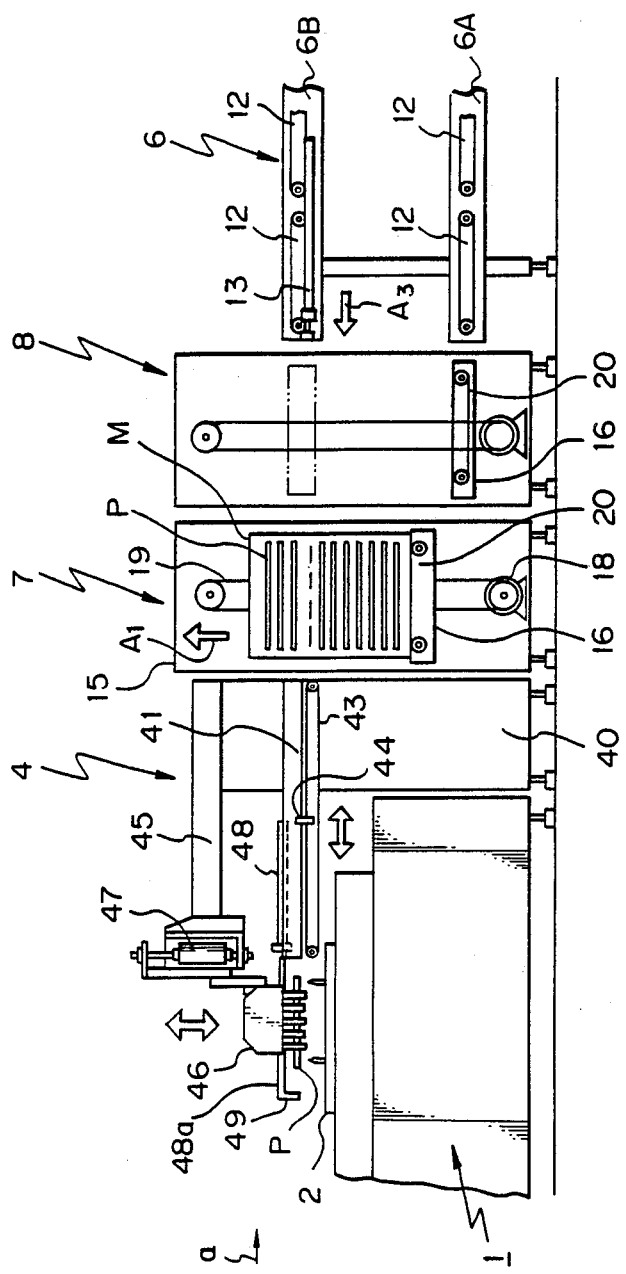
FIG. 3 is a detailed side view of the load-unload portion of the printed circuit board, load-unload system of FIG. 1.

FIG. 3 is a partial side view illustrating the construction around the transferring means 4 and the elevator units 7 and 8. As shown, the conveyor unit 6 includes an upper conveyor 6B and a lower conveyor 6A. Each of the conveyors 6A and 6B includes a plurality of conveyor belts 12, each of which can be driven frontward and rearward so that the magazines can be moved frontward and rearward. A cylinder 13 for pushing a printed circuit board and a detection means 14 (FIGS. 5, 10, 11) for detecting a printed circuit board in the magazine M are disposed in the frame of the upper conveyor 6B.

Figure 5:
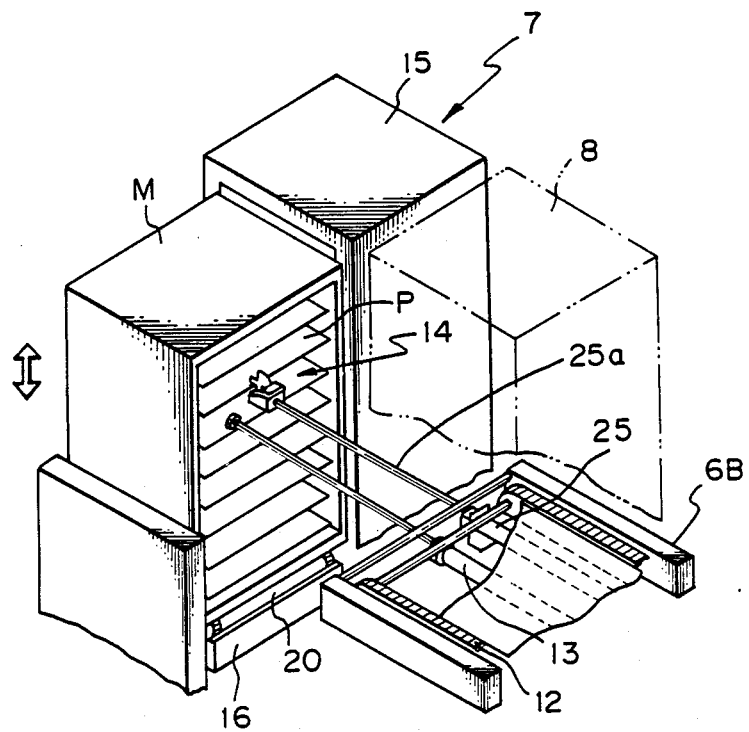
FIG. 5 is a perspective view of elevator means of the printed circuit board, load-unload system of FIG. 1 seen from the rear thereof.
Figure 6:
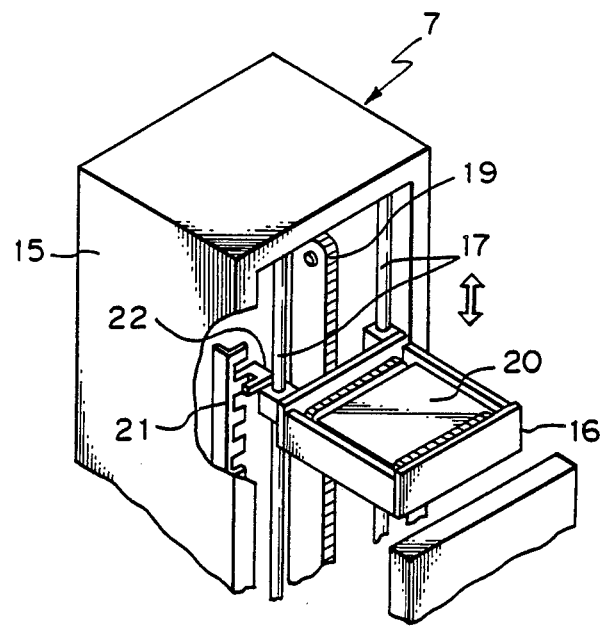
FIG. 6 is another perspective view of the elevator means of FIG. 5 seen from the front thereof.

The elevator units 7, 8, and 9 are essentially of the same construction. Each of the elevator units 7, 8, and 9 includes a U-shaped outer frame 15 (FIGS. 3, 5, and 6) and a platform 16 which is vertically movable along guide rods 17 (FIG. 6) secured to the outer frame 15. The platform 16 is driven by a motor 18 (FIG. 3) through a chain 19 (FIGS. 3 and 6). A conveyor belt 20, which is the same as the conveyor belt 12 of the conveyor unit 6, is disposed in the platform 16.

Figure 7:
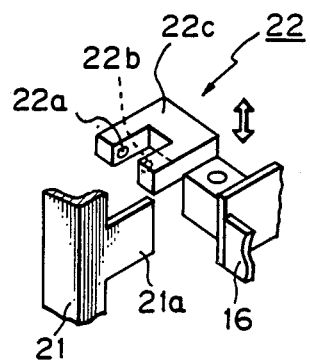
FIG. 7 is a partial detailed view of the elevator means of FIG. 6.
Figure 8:
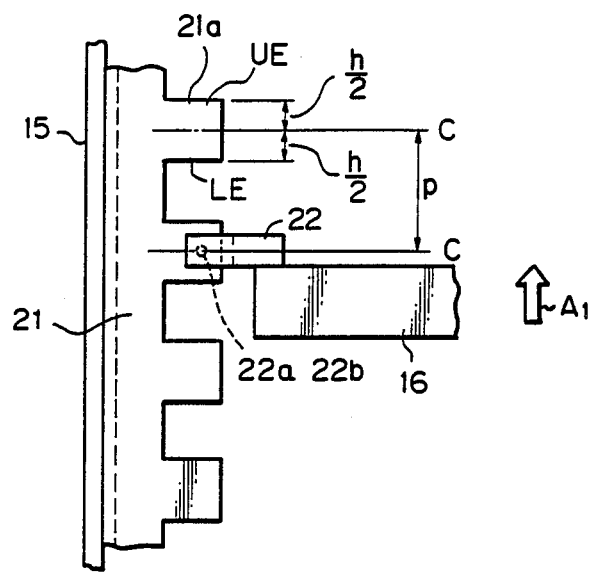
FIG. 8 is a side view of intermittent movement means of the elevator means of FIG. 6.
Figure 9:
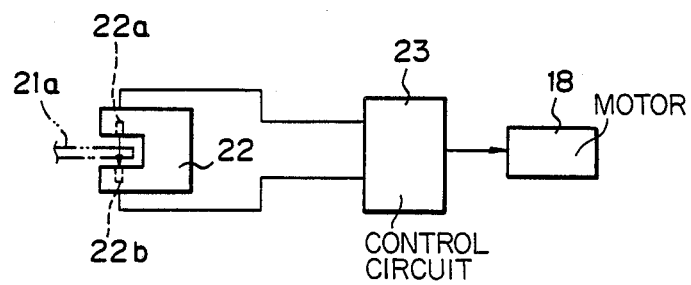
FIG. 9 is a block diagram of the intermittent movement means of FIG. 8.

The elevator unit 7, which is disposed adjacent to the transferring unit 4, is provided with means for intermittently elevating the platform 16 by intervals corresponding to the pitch of the printed circuit boards P housed in the magazine M. Such intermittent movement means includes a serration 21 and a sensor 22, e.g., a photocoupler, the serration 21 being secured to the outer frame 15, as shown in FIGS. 6, 7, and 8. The sensor 22 is secured to the platform 16 to move along therewith. The pitch (p) of the teeth 21a of the serration 21 (FIG. 8) is the same as the pitch of the printed circuit boards P in the magazine M. The width of each tooth 21a is (h). The sensor 22 includes a U-shaped member 22c and a pair of light emitting diodes (LED) 22a and a phototransistor 22b both of which constitute a photocoupler (FIG. 7). When the photocoupler detects a tooth 21a, the motor 18 is stopped by the function of a control circuit 23 (FIG. 9). Thus, the magazine M placed on the platform 16 is successively positioned at a level where the printed circuit boards P in the magazine can be transferred to the transferring means 4.

The control circuit 23 includes delay means, e.g., a pulse counter which emits a stop signal to stop the motor 18 after counting a predetermined number of pulses corresponding to half of the width (h) of each tooth 21a after the photocoupler (22a and 22b) detects the upper edge UE or the lower edge LE of each tooth 21a. With this arrangement, the motor 18 is stopped when the photocoupler (22a and 22b) is located at the center C of the tooth 21a irrespective of the direction (upward or downward) of the platform 16. Without such delay means, each stop position of the platform 16 in upward movement indicated by arrow A would differ from that in downward movement by a length corresponding to the width (h) of the tooth 21a, since the motor 18 is stopped when the photocoupler detects the lower edge LE of the tooth 21a in upward movement of the platform 16 and the motor 18 is stopped when the photocoupler detects the upper edge UE of the tooth 21a in downward movement of the platform 16. Such delay means may be omitted if the elevator unit 7 is operated such that the direction of the platform 16 is always the same.

Figure 10:
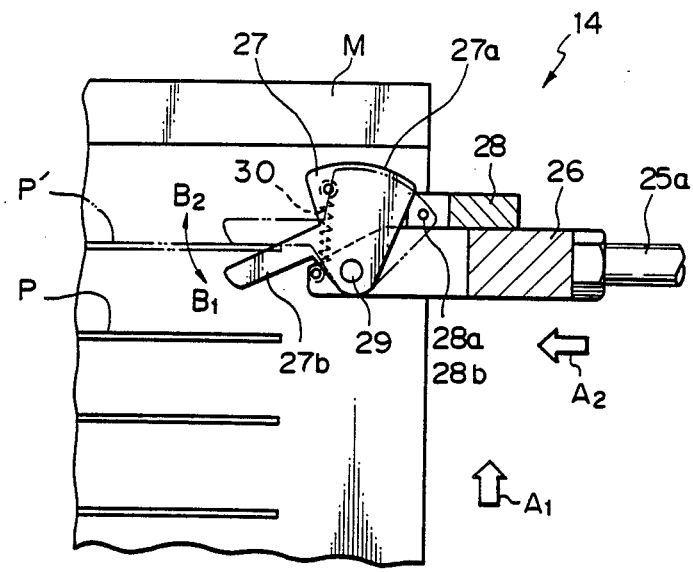
FIG. 10 is a side view of the printed circuit board detection means illustrated in FIG. 5.
Figure 11:
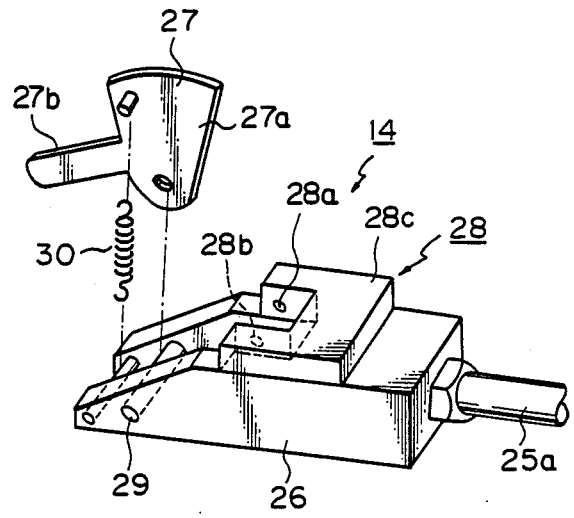
FIG. 11 is an exploded view of the detection means of FIG. 10.

The detection means 14 for detecting a printed circuit board P in the magazine M will now be explained with reference to FIGS. 5, 10, and 11. A cylinder 25 is secured to the frame of the upper conveyor 6B. A fork member 26 is secured to the end of a piston rod 25a assembled with the cylinder 25. A contact member 27 including a segment portion 27a and an abutment 27b is rotatably mounted on a pin 29 disposed at the end of the fork member 26. A spring 30 urges the contact member 27 in the direction of arrow $B_1$ (FIG. 10). A photosensor 28 is provided in the fork member 26. The photosensor 28 includes a U-shaped member 28c, an LED 28a, and a phototransistor 28b, constituting a photocoupler. The piston rod 265a is retracted in the cylinder 25 when the elevator unit 7 is not moved. The piston rod 25a projects into the magazine M, as shown by arrow $A_2$, when the elevator unit 7 is to be driven. When the magazine M is moved, for example, upwardly, as shown by arrow $A_1$, the abutment 27b of the contact member 27 abuts a printed circuit board P' so that the contact member 27 rotates in the direction of arrow $B_2$. The segment portion 27a of the contact member 27 thereby interferes with the photocouplers 28a and 28b, so that the presence of the printed circuit board P' is detected. After that, the printed circut board, load-unload function is started. If, however, the printed circuit board is not disposed at the predetermined position and the detection means does not detect the printed circuit board, the load-unload function is not executed and the magazine M is further moved to the next position.

If the magazine M is moved downwardly, the detection means 14 is arranged upside down.

The printed circuit board transferring means 4 (FIGS. 1, 2, and 3) includes a base 40 and guide rail means 41 mounted on the base 40. The guide rail means 41 includes a pair of rails (not shown) between which a printed circuit board is inserted. The printed circuit board is pushed out of the magazine M and transferred into the guide rail means 41 by a pusher means (described later) driven by the cylinder 13. The width of the guide rail means 41 (the distance between the pair of rails) is adjustable. A handle 42 is disposed to adjust the width of the guide rail means 41 to mate with the width of the printed circuit board to be transferred.

A conveyor chain 43 is disposed below the guide rail means 41. The conveyor chain 43 is movable in the frontward and rearward directions. A claw 44, which can be raised and lowered, is secured to the chain 43. The claw 44 is raised to engage the printed circuit board disposed in the guide rail means 41 and conveys the board by the chain 43. On the other hand, the claw 44 is lowered so as not to block the printed circuit board transferred from the magazine M.

Figure 4:
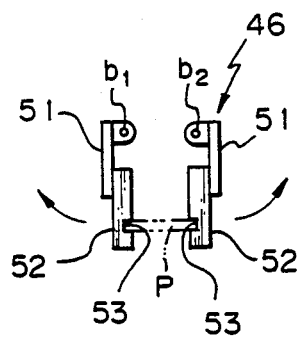
FIG. 4 is a front view of hand means of the printed circuit board, load-unload system of FIG. 1 seen from arrow (a) in FIG. 3.

An arm 45 is disposed above the guide rail means 41. A hand 46 for holding the printed circuit board P is provided at the end of the arm 45. The hand 46 is vertically movable by a cylinder 47. The hand 46 includes a pair of support plates 51 facing each other and rotatable about pivots $b_1$ and $b_2$, respectively (FIG. 4). Finger members 52, each of which has an inner groove 53 for holding the printed circuit board P, are secured to each support plate 51. The hand 46 can be opened as illustrated by the arrows in FIG. 4 by using a solenoid (not shown), for example. The hand 46 moves vertically above the X-Y table 2 so as to mount and dismount the printed circuit board P. A cylinder 48 is disposed on the guide rail means 41. The cylinder 48 drives a piston rod 48a which has a claw 49 at the front end thereof for transferring the printed circuit board P held by the hand 46 to the guide rail 41.

The printed circuit board transferring means 4 functions as follows. The magazine M is moved in the direction of arrow $A_1$ (FIG. 3) and is intermittently stopped, as described before. When the magazine M is stopped, after the presence of the printed circuit board is recognized by the detection means 14, the piston rod of the cylinder 13 is projected beyond the elevator unit 8 in the direction of arrow $A_3$ so as to push the printed circuit board held in the magazine M and transfer it to the guide rail means 41. The printed circuit board transferred to the guide rail means 41 is then conveyed to the hand 46 by the claw 44 of the chain 43 and inserted into the grooves 53 of the finger members 52 (FIG. 4). Then, the hand 46 descends onto the X-Y table 2 to mount the printed circuit board P thereon. The hand 46 opens, releases the printed circuit board P, and then ascends. The X-Y table 2 then moves to the IC insertion position where IC's (not shown) are mounted on the printed circuit board P. The X-Y table returns to the position of FIG. 3, where the hand 46 grips the printed circuit board P again and ascends to dismount it from the X-Y table 2. The printed circuit board P is transferred to the guide rail means 41 by the claw 49 of the cylinder 48. After that, the printed circuit board P is conveyed backward by the claw 44 of the chain 43 and returned into the magazine M. The magazine M is moved upward by one pitch and the transferring operation of the subsequent printed circuit board is effected.

Figure 12:
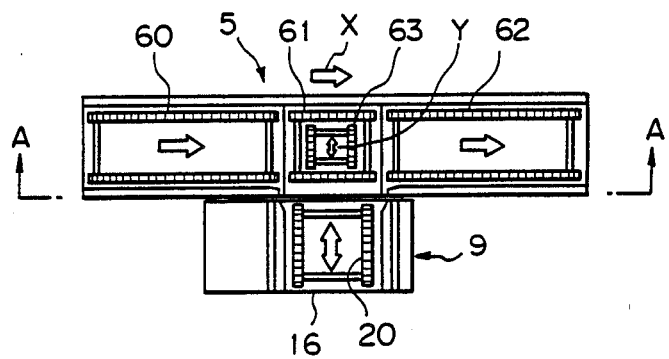
FIG. 12 is a plan view of conveyor means connected to the stock means of an embodiment of the printed circuit board, load-unload system in accordance with the present invention.
Figure 13:
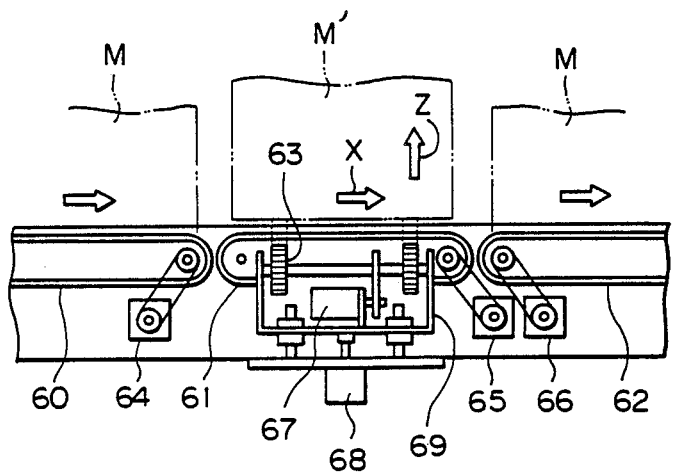
FIG. 13 is an elevational view of the conveyor means of FIG. 12.

FIG. 12 is a plan view of the conveyor 5 disposed behind the elevator unit 9 of the stock means 3 (FIGS. 1, 2), and FIG. 13 is a side view of the conveyor 5 seen from arrows A is FIG. 12. The conveyor 5 includes conveyor belts 60, 61, and 62 for conveying magazines M in the direction X and a conveyor belt 63 for conveying magazines M in the direction Y and transferring them to the stock means 3 through the elevator unit 9. These conveyor belts 60, 61, 62, and 63 are driven by motors 64, 65, 66, 67, respectively. The conveyor belt 63 in the direction Y is mounted on a platform 69 which is vertically movable by a pneumatic cylinder 68. The conveyor belt 63 is normally disposed below the level of the conveyor belt 62 in the direction X. When a magazine M is conveyed to the position M' behind the elevator unit 9, the conveyor belts 60 and 61 are stopped. Then, the conveyor belt 63 ascends in direction Y above the level of the conveyor belt 61. The conveyor belt 63 and the conveyor belt 20 of the elevator unit 9 are driven to transfer the magazine M onto the platform 16 of the elevator unit 9. The magazine M is further transferred to the lower conveyor 6A of the magazine stock means 3. On the other hand, when a magazine M is to be transferred from the stock means 3 to the conveyor 5, the conveyor belts 20 and 63 are reversely driven to transfer the magazine M onto the conveyor belt 61, and the conveyor belt 63 descends. Then, the conveyor belts 61 and 62 are driven to convey the magazine M in the direction X.

The function of the magazine stock means 3 will be described hereinafter with reference to FIGS. 14(A) to 14(C), in which only main parts are illustrated.

Figure 14A:
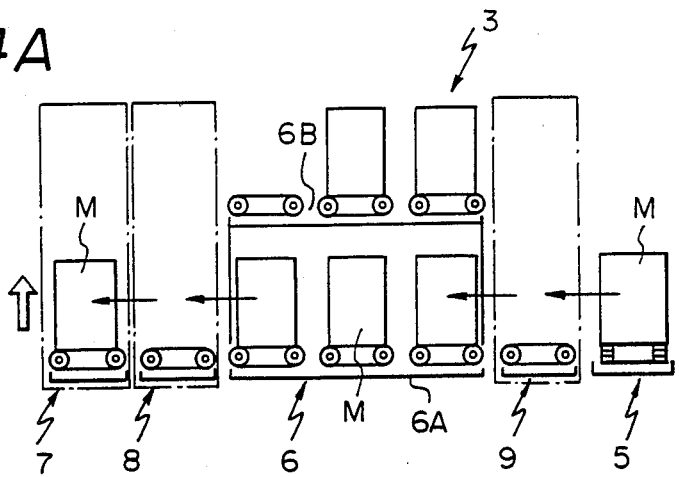
FIGS. 14(A) to 14(C) are views illustrating the magazine conveying function of the printed circuit board, load-unload system of FIG. 1.

(1-1) First, a magazine M housing printed circuit boards on which IC components are to be mounted is conveyed behind the elevator unit 9 by the conveyor 5 (FIG. 14(A)). The magazine M is transferred to the lower conveyor 6A of the stock means 3, as described before with reference to FIGS. 12 and 13. In the following example, the lower conveyor 6A is used for stocking and conveying pre-processing magazines which house printed circuit boards on which IC's are not yet mounted, while the upper conveyor 6B is used for stocking and conveying post-processing magazines which house printed circuit boards on which IC's are mounted by the inserter 1. However, the load-unload system can be operated such that pre-processing magazines are disposed on both the upper conveyor 6B and the lower conveyor 6A so that the magazines are processed by an unmanned operation of the inserter 1 through the night.

(1-2) After a predetermined number of magazines are stocked in the lower conveyor 6A, the foremost magazine is transferred to the elevator unit 7 through the elevator unit 8. The elevator unit 8 functions to group the magazines, as described later.

(1-3) When the magazine M is transferred to the elevator unit 7, the magazine M is intermittently raised and the printed circuit board is transferred to the inserter 1, where IC components are mounted, and returned to the magazine by the transferring means 4, as described before with reference to FIG. 3.

Figure 14B:
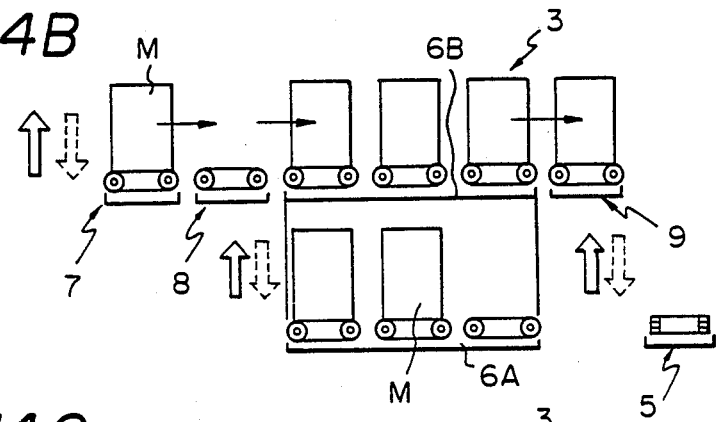
Figure 14C:
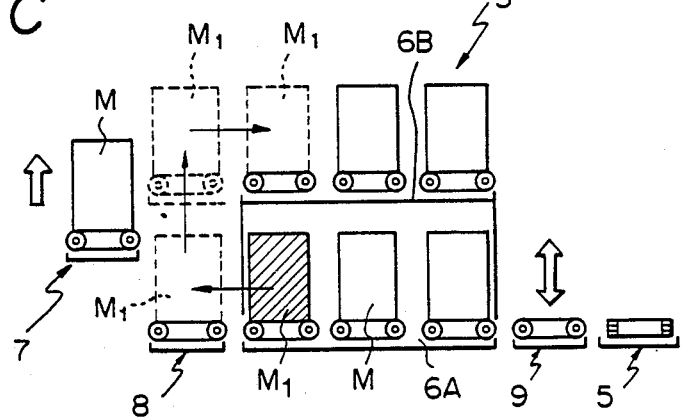

(1-4) When the IC mounting operation for all of the printed circuit boards within one magazine M is finished, the magazine M is transferred to the upper conveyor 6B of the stock means 3 through the elevator unit 8 for grouping the magazines (FIG. 14B).

(1-5) The empty elevator units 7 and 8 are descended to receive a subsequent pre-processing magazine M (FIG. 14A) and step (1-3) and step (1-4), are repeated. The elevator units 7 and 8 descend continuously, not intermittently.

(1-6) The post-processing magazine M transferred to the upper conveyor 6B is conveyed to the elevator unit 9 as shown in FIG. 14(B). The elevator unit 9 descends and delivers the magazine M to the conveyor 5. Such a load-unload operation of the post-processed magazines to the conveyor 5 may be executed after all of the magazines stocked on the lower conveyor 6A are processed by the inserter 1 and transferred to the upper conveyor 6B.

The post-processing magazines may be transferred from the upper conveyor 6B to the lower conveyor 6A and stocked there again, instead of being transferred to the outer conveyor 5.

The elevator unit 8 for grouping magazines functions as follows. As illustrated in FIG. 14(C), when one magazine M is intermittently raised by the elevator unit 7, if the subsequent magazine $M_1$ waiting at the forefront of the lower conveyor 6A contains different printed circuit boards, the magazine $M_1$ is transferred to the upper conveyor 6B by the elevator unit 8. Therefore, a magazine M disposed behind the different magazine $M_1$ and storing the same printed circuit boards can be arranged at the forefront in the lower conveyor 6A while the printed circuit boards in the preceding same magazine M are processed by the inserter 1.

As mentioned above, if a magazine storing different printed circuit boards is present in the lower conveyor 6A of the stock means 3, that magazine can be transferred to the upper conveyor 6B, bypassing the elevator unit 7, so that the same magazines can be grouped and continuously transferred to the elevator unit 7 in sequence. Therefore, the inserter 1 can continuously deal with the same printed circuit boards, which enhances the efficiency of the operation of the inserter.

Figure 15:
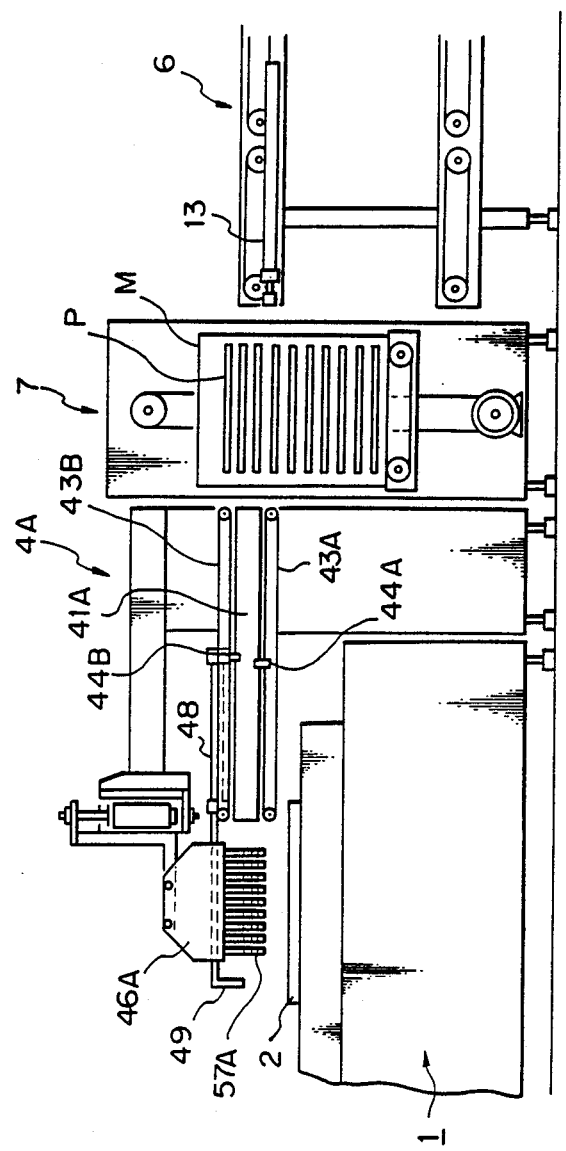
FIG. 15 is a partial side view of another embodiment of the present invention.
Figure 16A:
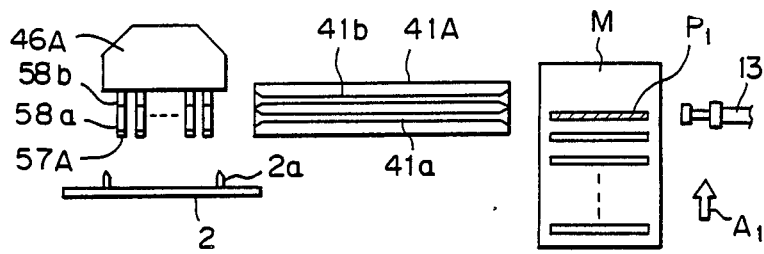
FIGS. 16(A) to 16(K) are views for illustrating the function of the embodiment of FIG. 15.

Another example of the printed circuit board transferring means is illustrated in FIG. 15. Guide rail means 41A of this transferring means, referenced as 4A, includes two guide grooves 41a and 41b (see FIG. 16(A)), the distance between which is equal to the pitch of the printed circuit boards in the magazine M. An upper conveyor chain 43B provided with a claw 44B is disposed above the guide rail means 41A in addition to the lower conveyor chain 43A, which is provided with a claw 44A and disposed below the guide rail means 41A. The hand 46A is similar to the hand 46 of FIGS. 3 and 4, except that the finger member 57A thereof includes two grooves 58a and 58b (FIG. 16(A)), corresponding to the two guide grooves 41a and 41b of the guide rail means 41A.

The function of this example is described hereinafter with reference to FIGS. 16(A) to 16(K) and to FIG. 17, in which the time chart of the function is illustrated.

(2-1) First, the magazine M is raised, as shown by arrow $A_1$ (FIG. 16A), from the lowermost position to the position where the uppermost printed circuit board $P_1$ (hatched in the drawing) is located at the level shared by the cylinder 13 for pushing the printed circuit board and the lower guide groove 41a of the guide rail means 41A. The presence of the printed circuit board $P_1$ is checked by the detection means 14 (FIG. 5) as described before.

Figure 16B:
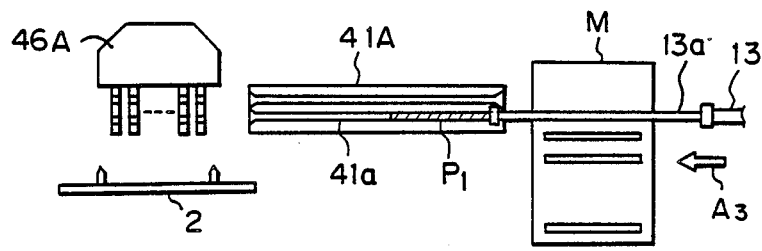
Figure 17:
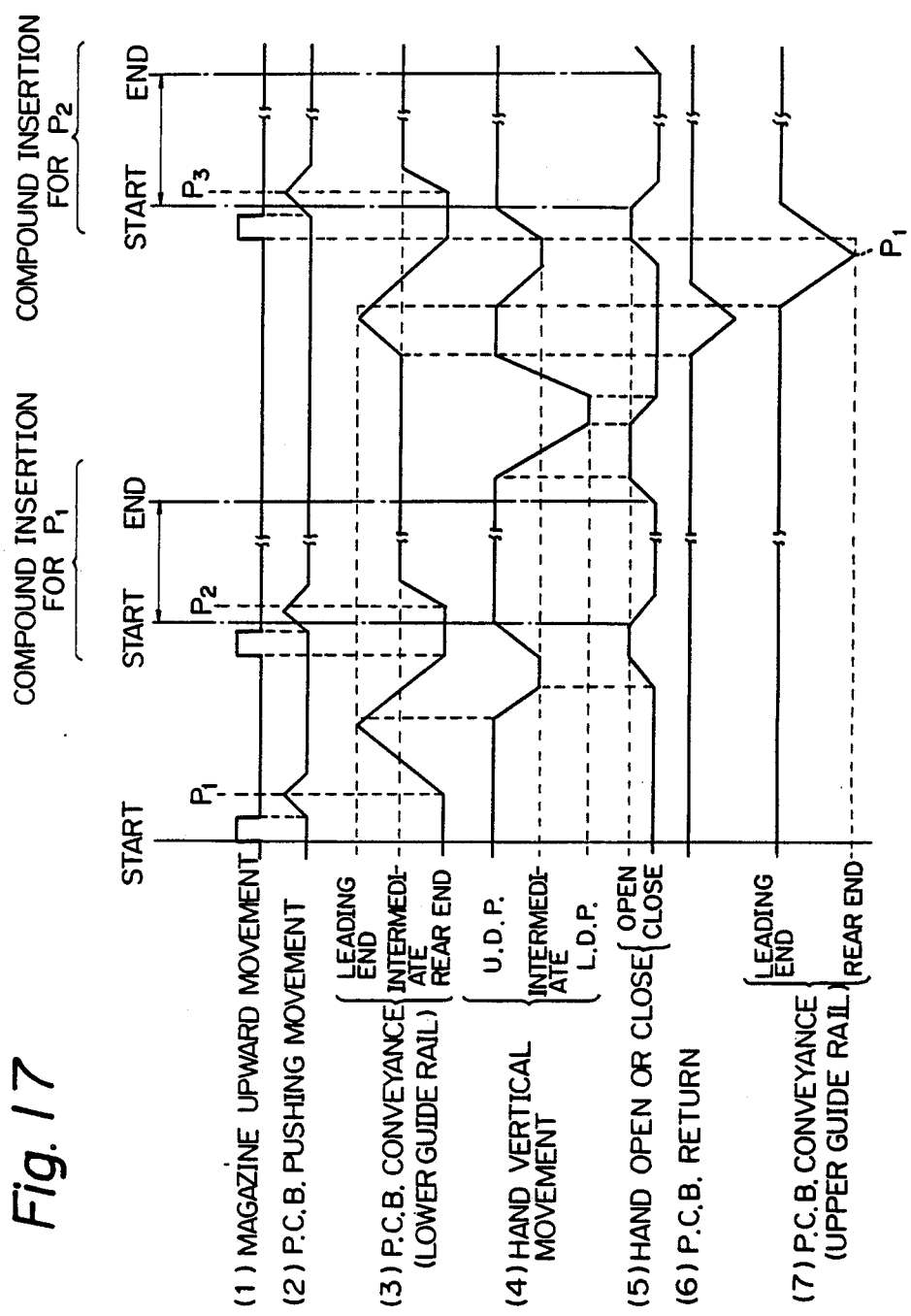
FIG. 17 is a time chart of the function of the embodiment of FIG. 15.

(2-2) The piston rod 13a of the cylinder 13 is projected in the direction of arrow $A_3$, to push the printed circuit board $P_1$ out of the magazine M and into the lower guide groove 41a of the guide rail means 41A, as illustrated in FIG. 16(B).

Figure 16C:
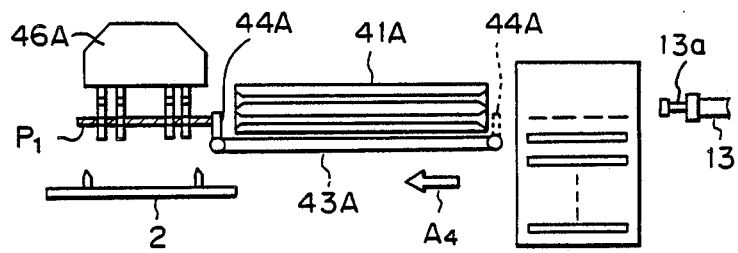

(2-3) Then, the piston rod 13a is retracted, as shown in FIG. 16(C). The claw 44A of the lower conveyor chain 43A is raised, as illustrated by the dotted line, and driven by the chain 43A frontward (in the direction of arrow $A_4$) to convey the printed circuit board $P_1$ into the lower groove 58a of the hand 46A.

Figure 16D:
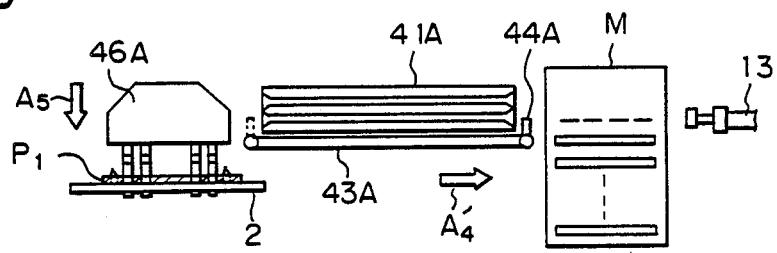
Figure 16:
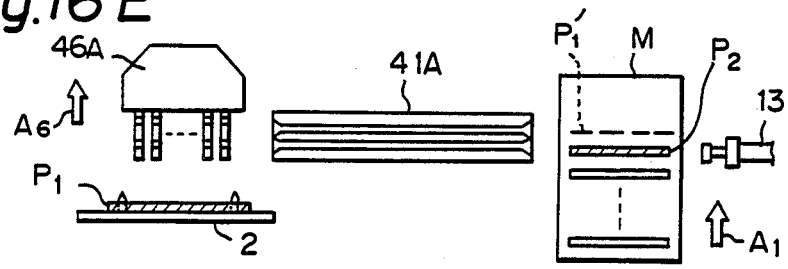
Figure 16:
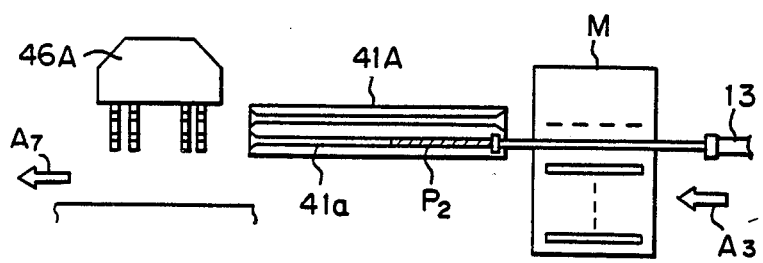
Figure 16:
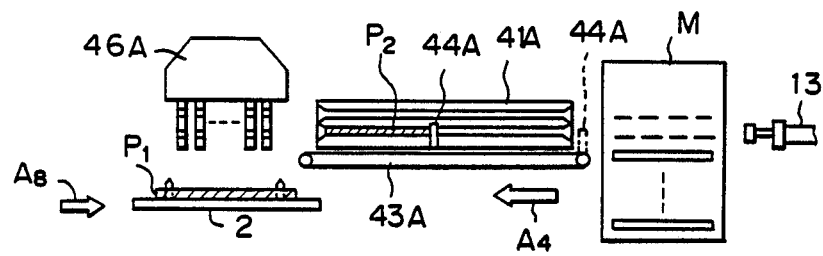
Figure 16:
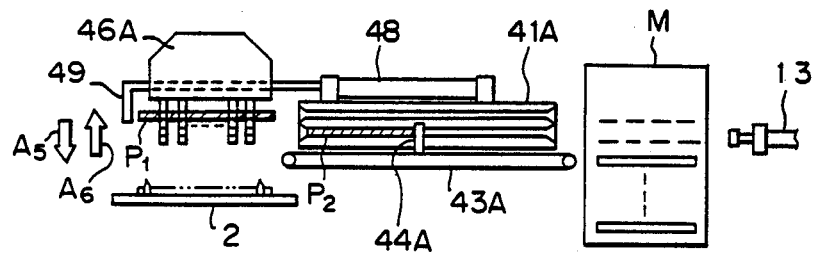
Figure 16:
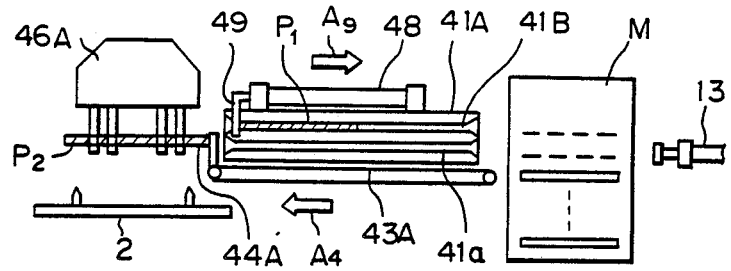
Figure 16:
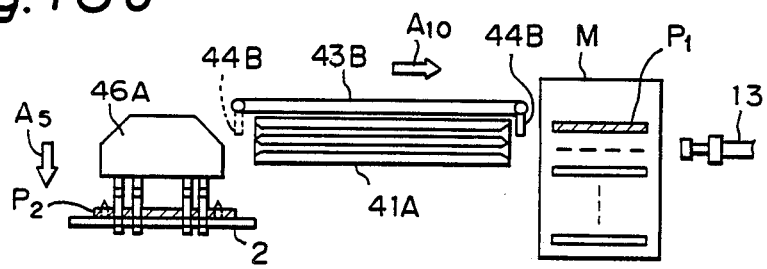
Figure 16:
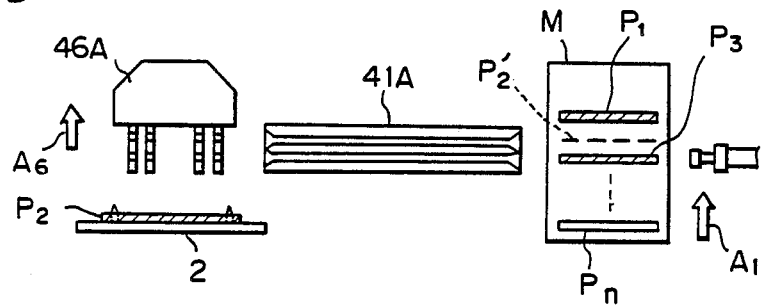

(2-4) Then, the claw 44A is driven backward (in the direction of arrow $A_4'$) as illustrated in FIG. 16(D). The hand 46A holding the printed circuit board $P_1$ descends as shown by arrow $A_5$ to mount the printed circuit board $P_1$ on mounting pins 2a of the X-Y table 2 of the inserter 1. The position of the hand 46A illustrated in FIG. 16(D) is an intermediate point between an upper dead point (U.D.P.) and a lower dead point (L.D.P.) of the hand 46A, which is shown in FIG. 17.

(2-5) The hand 46A opens to release the printed circuit board $P_1$ and ascends as shown by arrow $A_6$ in FIG. 16(E). This timing is represented in FIG. 17. During this step, the magazine M is raised in the direction of Arrow $A_1$ by one pitch so that the second printed circuit board $P_2$ faces the lower guide groove 41a of the guide rail 41A and so that the uppermost position $P_1'$, i.e., where the first printed circuit board $P_1$ was disposed, faces the upper guide groove 41b of the guide rail 41A.

(2-6) The X-Y table 2 is moved in the direction of arrow $A_7$ to the position (not shown) where electronic components are inserted on the printed circuit board $P_1$ (see FIG. 17), as shown in FIG. 16(F). The second printed circuit board $P_2$ is pushed by the cylinder 13 in the direction of arrow $A_3$ out of the magazine M and into the lower guide groove 41a of the guide rail means 41A.

(2-7) The claw 44A of the lower conveyor chain 43A is driven frontward in the direction of arrow $A_4$ to advance the second printed circuit board $P_2$ to the front end of the guide groove 41a. The X-Y table 2 is returned in the direction of arrow A8 to the original printed circuit board mounting and dismounting position as illustrated in FIG. 16(G).

(2-8) After the X-Y table 2 is returned, the hand 46A opens and descends in the direction of arrow A5 to its lower dead point where it closes to grip the printed circuit board P1 within the upper grooves 58b of the finger members 57A thereof. The hand 46A ascends again in the direction of arrow A6 to the upper dead point thereof, so that the printed circuit board P1 is located at the level of the upper guide groove 41b of the guide rail means 41A, as can be seen from FIGS. 16(H) and 17.

(2-9) Then, as illustrated in FIG. 16(I), the piston rod of the cylinder 48 is retracted in the direction of arrow A9 so that the claw 49 engages with the printed circuit board P1 to transfer it from the hand 46A to the upper guide groove 41b of the guide rail means 41A. Also, simultaneously with this transferring function, the claw 44A of the lower conveyor chain 43A is driven further frontward in the direction of arrow A4 from the intermediate position of FIG. 16(G) so as to transfer the second printed circuit board P2 from the guide rail means 41A to the lower groove 58a of the hand 46A.

(2-10) The hand 46A descends in the direction of arrow A5 to the intermediate point to mount the second printed circuit board P2 on the X-Y table 2. The claw 44B of the upper conveyor chain 43B projects out as shown by the dotted line in FIG. 16(J) and is driven by the conveyor chain 43B backward in the direction of arrow A10 to return the printed circuit board P1 to the original position in the magazine M.

(2-11) The hand 46A releases the second printed circuit board P2 and ascends in the direction of arrow A6 to the upper dead point (FIG. 16K). The mounting operation of electronic components for the second printed circuit board P2 is started at the parts mounting position. Also, the magazine M is moved upward in the direction of arrow A1 by another one pitch for repeating the above-mentioned steps for the other printed circuit boards P2', P3, and Pn housed within the magazine M.

As mentioned above, the second example of the printed circuit board transferring means 4A includes a guide rail means 41A having two guide grooves 41a and 41b and a hand 46A having two grooves 58a and 58b, respectively. Therefore, it is possible to transfer a printed circuit boad from the magazine to the guide rail means and keep it in the guide rail means while the preceding printed circuit board is processed by the inserter. Also, it is possible to transfer the printed circuit board from the guide rail means to the hand simultaneously with the transfer of the preceding printed circuit board from the hand to the guide rail means. Therefore, the efficiency of the load-unload function is enhanced.

It is apparent that the above-mentioned structure can be utilized when the magazine is intermittently moved downwardly instead of being moved upwardly.

Figure 18:
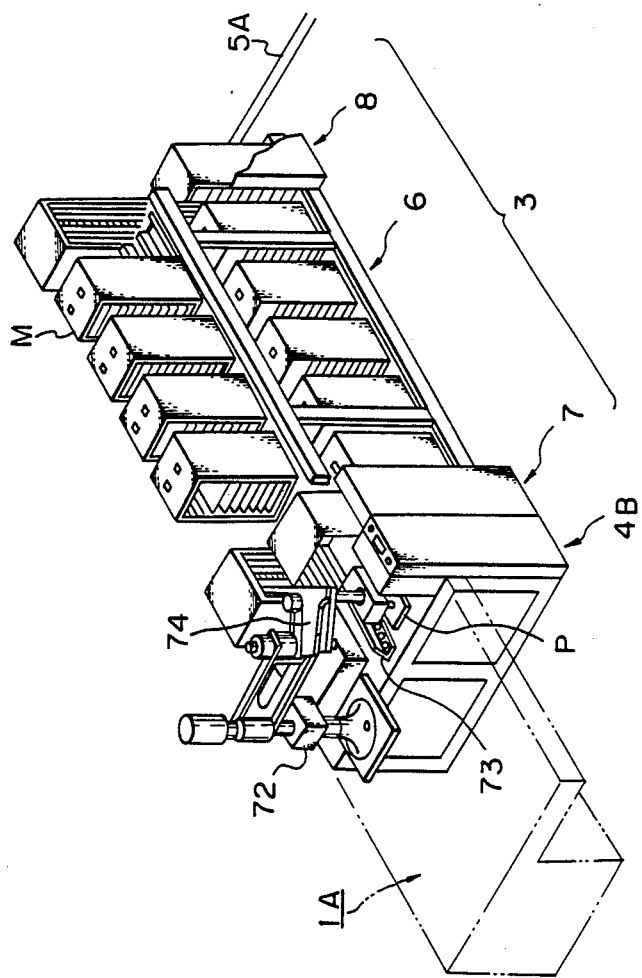
FIG. 18 is a perspective view of another embodiment of the printed circuit board, load-unload system in accordance with the present invention.
Figure 19:
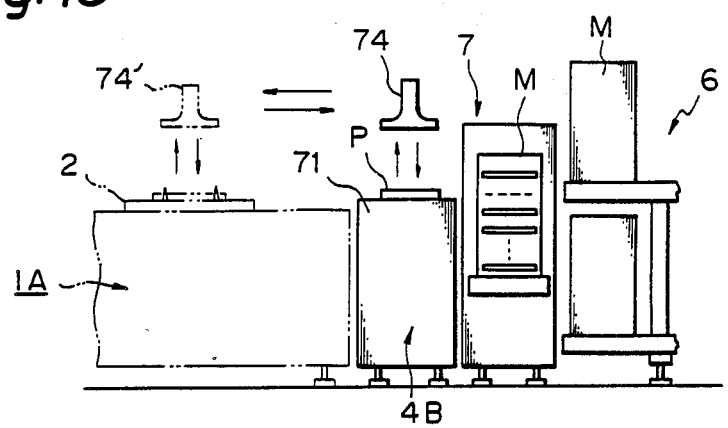
FIG. 19 is a view illustrating the function of the embodiment of FIG. 18.

Another embodiment of the present invention is illustrated in FIGS. 18 and 19. In this embodiment, the printed circuit board transferring means (4B) includes a robot 72 having a hand 74 which is movable vertically and horizontally. When a printed circuit board P is pushed onto a table 71 from the magazine M, the robot hand 74 descends and grips the printed circuit board P. Then, the robot hand 74 ascends and moves horizontally to the position 74' above the X-Y table 2 and descends to mount the printed circuit board P on the X-Y table 2. A printed circuit board processing device 1A, for example, a testing machine, conducts various tests on the printed circuit board P on the X-Y table 2. After that, the robot hand 74 grips the printed circuit board P on the X-Y table 2 and returns it to the table 71 of the transferring means 4B. Then, the printed circuit board P is inserted back into the magazine M in the manner described before. By using a robot, the printed circuit board can be easily transferred to various positions. Therefore, the load-unload system can be applied to various kinds of insertion machines or testing machines.

A guide 73 is provided on the table 71 of the transferring means 4B. The printed circuit board P is guided to a predetermined position by the guide 73, so that the robot hand 74 can easily obtain access to the printed circuit board P. The size of the guide 73 is adjustable in accordance with the size of the printed circuit board.

The printed circuit board magazines are delivered to and from the magazine stock means 3 by an automatic carrier (not shown) which runs along the line 5A, instead of the outer conveyor 5 of the aforementioned embodiments. Such an automatic carrier may also be used in place of the conveyor 5 in each embodiment of the present invention.

Figure 22:
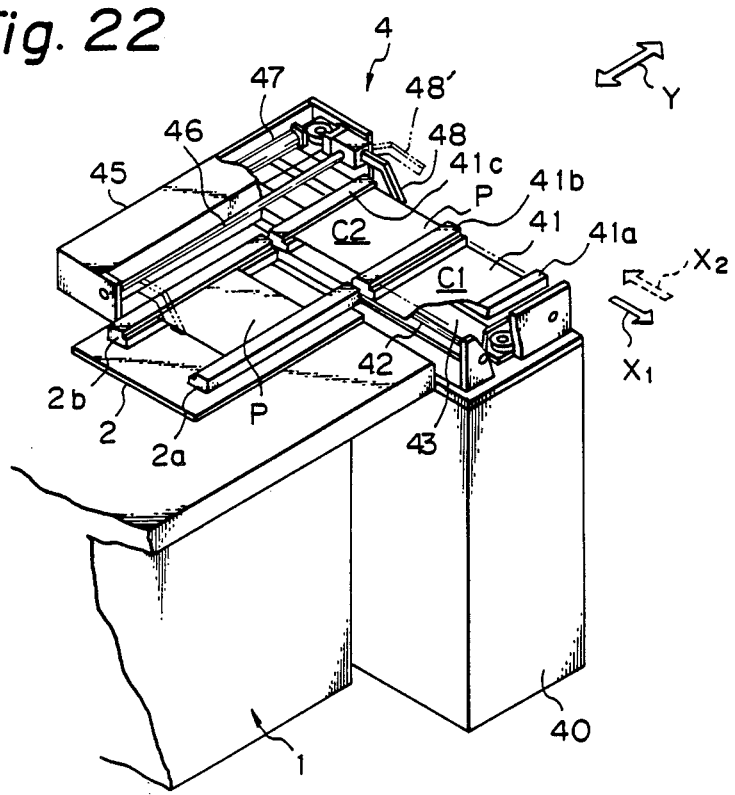
FIG. 22 is a partial perspective view of the embodiment of FIGS. 20 and 21.
Figure 20:
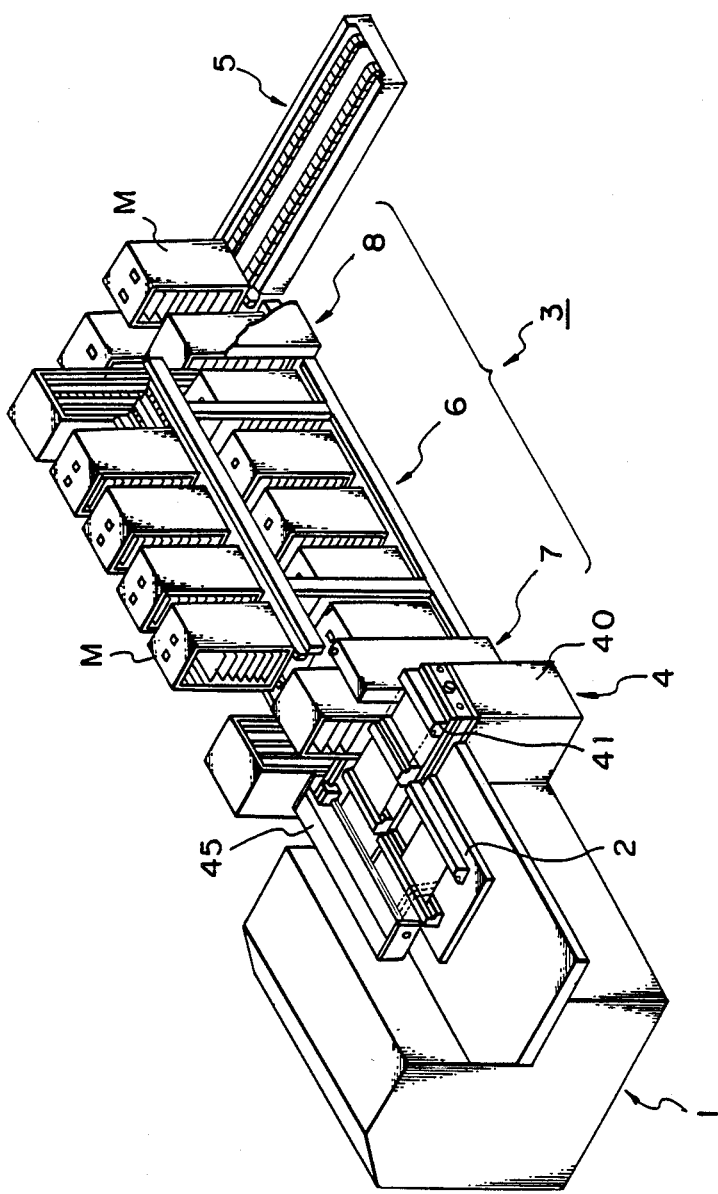
FIG. 20 is a perspective view of another embodiment of the printed circuit board, load-unload system in accordance with the present invention.
Figure 21:
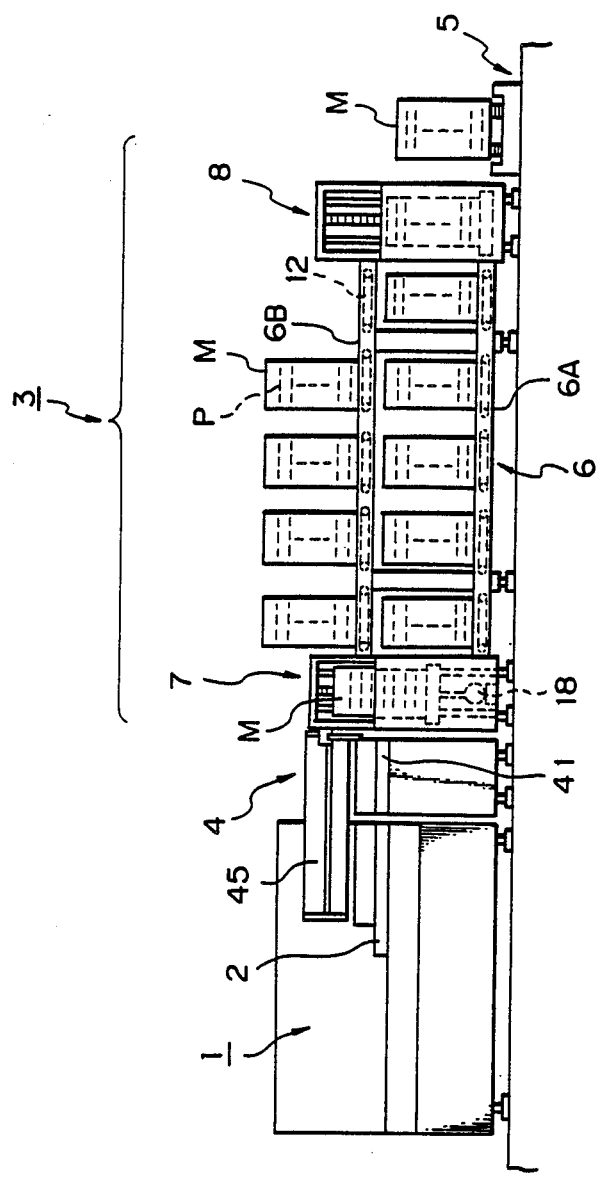
FIG. 21 is a side view of the printed circuit board, load-unload system of FIG. 20.

Another embodiment of the present invention is illustrated in FIGS. 20 through 22. In this embodiment, the printed circuit board transferring means 4 is different from that of the aforementioned embodiments. The transferring means 4 of this embodiment includes a change table 41 and a feed means 45. The feed means 45 includes a claw 48 which is movable in the direction Y along a guide rod 46 by the function of a cylinder 47. The change table 41 has two table surfaces $C_1$ and $C_2$, which are defined by guide rails 41a, 41b, and 41c and movable in the direction of arrows $X_1$ and $X_2$. Two guide rails 2a and 2b for receiving a printed circuit board P are disposed on the X-Y table 2 of the printed circuit board processing device 1. The guide rails 2a and 2b are aligned either with guide rails 41a and 41b defining the table surface $C_1$ or guide rails 41b and 41c defining the other table surface $C_2$ by changing the table surface. The claw 48 of the feed means 45 engages and pushes the front edge or the rear edge of the printed circuit board P so as to deliver the printed circuit board P between the change table 41 and the magazine M (not shown) or the change table 41 and the X-Y table 2. The claw 48 can be retracted to the inoperative position 48'.

The function of the printed circuit board transferring means 4 of FIG. 22 will be described hereinafter with reference to FIGS. 23(A) to 23(I).

Figure 23A:
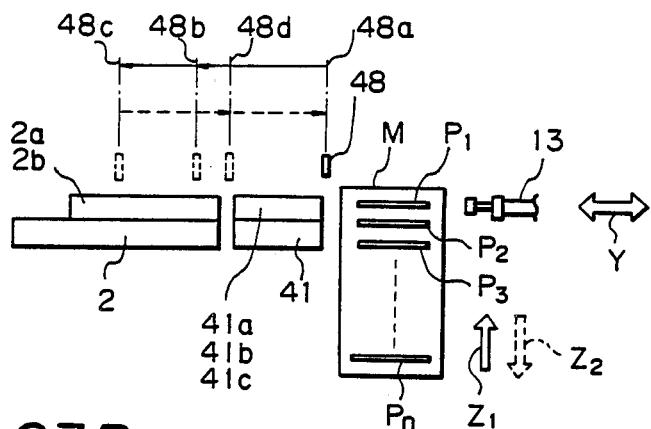
FIGS. 23(A) to 23(I) are views illustrating the printed circuit board, load-unload function of the embodiment of FIG. 22.

(3-1) First, the magazine M which can be lowered, as shown by arrow $Z_2$ of FIG. 23(A), or raised, as shown by arrow $Z_1$ of FIG. 23(A), is raised from the lowermost position to the position where the uppermost printed circuit board $P_1$ is located at the level of the cylinder 13 for pushing the printed circuit board. The presence of the printed circuit board $P_1$ is checked by the detection means 14 (FIG. 5), as described before.

Figure 23B:
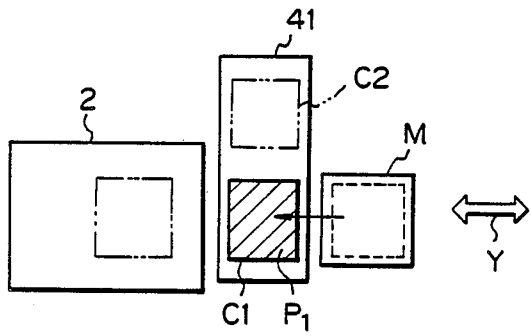
Figure 23C:
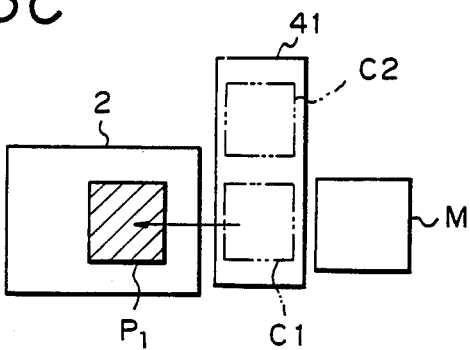

(3-2) The first table surface $C_1$ of the change table 41, for example, is located at the transferring position for receiving the printed circuit board $P_1$ from the magazine M, as illustrated in FIG. 23(B).

(3-3) THe claw 48 of the feed means 45 is moved from the point 48a to the point 48b (FIG. 23(A)), so that the printed circuit boad $P_1$ is conveyed from the change table 41 to the X-Y table 2. The claw 48 is further moved to the point 48c in its inoperative position 48' (FIG. 22) and waits at this point.

Figure 23D:
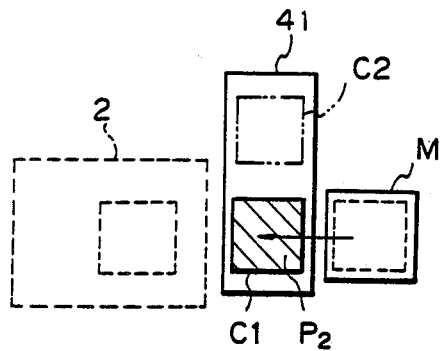

(3-4) The X-Y table 2 is moved to the IC insertion position where IC components are mounted on the printed circuit board $P_1$ by the inserter 1. Also, while the IC insertion operation is executed by the inserter 1, the magazine M is raised by one pitch so that the second printed circuit board $P_2$ is located at the level of the guide rails 41a, 41b, 41c of the change table 41. The second printed circuit board $P_2$ is pushed onto the table surface $C_1$ of the change table 41, as illustrated in FIG. 23(D).

Figure 23E:
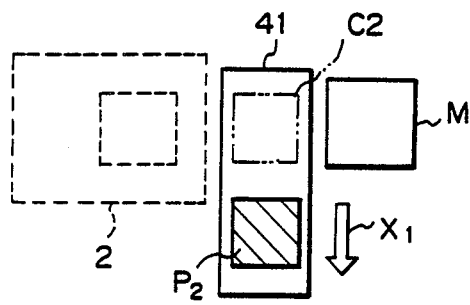

(3-5) The change table 41 is moved in the direction $X_1$, as illustrated in FIG. 23(E), so that the second table surface $C_2$ of the change table 41 faces the magazine M.

Figure 23F:
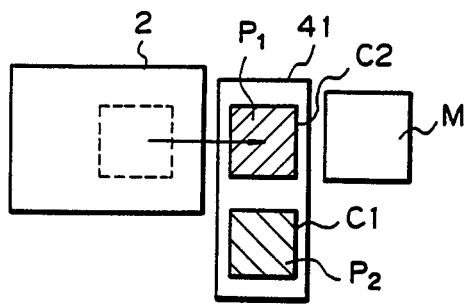

(3-6) The X-Y table 2 returns to the position for mounting and dismounting each printed circuit board P, as illustrated in FIG. 23(F), after the IC component insertion operation for the first printed circuit board $P_1$ is finished. Then, the claw 48 is shifted to the operative position (solid line in FIG. 22) and moved from the point 48c to the point 48d (FIG. 23(A)), so that the printed circuit board $P_1$ is transferred to the second table surface $C_2$ of the change table 41. The claw 48 is then shifted to the inoperative position 48', moved to the point 48a, and waits at this point.

Figure 23G:
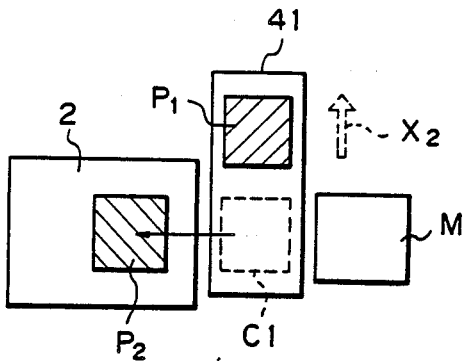

(3-7) The change table 41 is shifted in the direction $X_2$ so that the first table surface $C_1$ faces the magazine M, as illustrated in FIG. 23(G). The second printed circuit board $P_2$ placed on the first table surface $C_1$ is transferred to the X-Y table 2 by the claw 48.

Figure 23H:
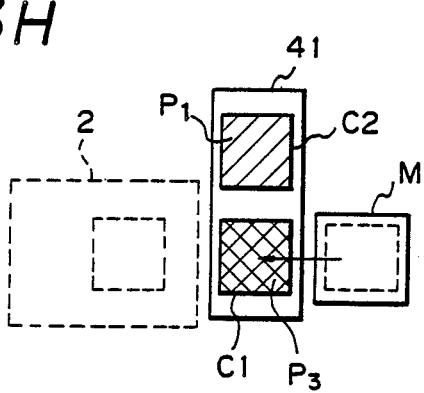

(3-8) The X-Y table 2 is moved to the IC insertion position where IC components are mounted on the second printed circuit board $P_2$ by the inserter 1. While the IC insertion operation is executed by the inserter 1, the magazine M is raised by another pitch so that the third printed circuit board $P_3$ is located at the level of the guide rails 41a, 41b, 41c of the change table 41. The third printed circuit board $P_3$ is pushed onto the table surface $C_1$ of the change table 41, as illustrated in FIG. 23(H).

Figure 23I:
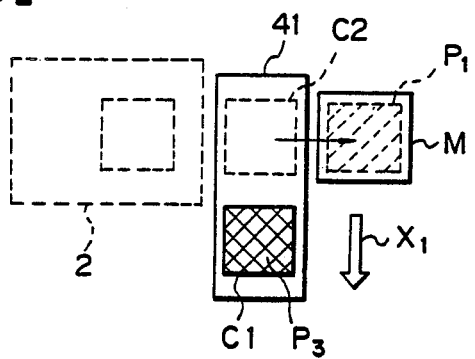

(3-9) The change table 41 is shifted in the direction $X_1$, as illustrated in FIG. 23(I), so that the second table surface $C_2$ faces the magazine M. The magazine M is lowered by two pitches so that the vacant uppermost position where the first printed circuit board $P_1$ was held is located at the level of the guide rails 41b and 41c of the second table surface $C_2$. The claw 48 pushes and transfers the printed circuit board $P_1$ from the second table surface $C_2$ to the magazine M.

(3-10) The above-mentioned operation (step (3-6) to (3-9)) is repeated for the subsequent printed circuit boards Pn.

We claim:

1. A printed circuit board, load-unload system, comprising:
   (a) a printed circuit board processing portion including a printed circut board table;
   (b) a magazine stock portion where a plurality of magazines, each of which houses a plurality of printed circuit boards, is arranged on a conveyor route;
   wherein each of said plurality of printed circuit boards is horizontally housed in said plurality of magazines, one above the other, at predetermined intervals;
   (c) a load-unload portion where each of the plurality of printed circuit boards is transferred between the magazine stock portion and said printed circuit board processing portion;
   wherein said magazine stock portion includes means for pushing each of the plurality of printed circuit boards, one at a time, from one of said plurality of magazines to said load-unload portion,
   (d) magazine conveyor means connected to said conveyor route of said magazine stock portion, said magazine conveyor means including means for transferring each of said plurality of magazines to and from the system;
   (e) means for detecting the presence of each of the plurality of printed circuit boards at the position corresponding to said pushing means in said one of said plurality of magazines;
   said conveyor route including:
   (1) upper conveyor means;
   (2) lower conveyor means disposed below said upper conveyor means;
   (3) first elevator means disposed at one end of said upper and lower conveyor means and having vertical step feed means for intermittently stopping the magazine conveyed thereon and transferring printed circuit boards housed in the magazine, one at a time, between the magazine and said load-unload portion,
   wherein said first elevator means, which is disposed adjacent to said load-unload portion, includes an elevating platform for mounting each of the plurality of magazines, a motor for driving said platform within an elevation area, a serration-shaped positioning means disposed along the elevation area of said platform, said positioning means having teeth at regular intervals, detection means for detecting said teeth of said positioning means, and a delay circuit for stopping said motor a predetermined time after said detection means detects each tooth of said positioning means, and elevates each of the plurality of magazines intermittently, step-by-step, at a regular pitch corresponding to said intervals of each of the plurality of printed circuit boards in each of said plurality of magazines,
   (4) second elevator means disposed at the other end of said upper and lower conveyor means for transferring the magazine between the upper and lower conveyor means; and
   (5) third elevator means disposed between the first elevator means and the upper and lower conveyor means for selectively transferring the magazine between the first elevator means and the upper and lower conveyor means and between the upper conveyor means and the lower conveyor means to constitute a bypass route for bypassing the magazine, and
   said load-unload portion includes a passage for passing each of said plurality of printed circuit boards, and hand means for holding each of said plurality of printed circuit boards on said passage and conveying each of said plurality of printed circuit boards to the printed circuit board table of said printed circuit board processing portion.

* * * * *